(12) United States Patent
Jeon et al.

(10) Patent No.: US 8,697,494 B2
(45) Date of Patent: Apr. 15, 2014

(54) METHOD OF MANUFACTURING A FLIP CHIP PACKAGE AND APPARATUS TO ATTACH A SEMICONDUCTOR CHIP USED IN THE METHOD

(75) Inventors: Chang-Seong Jeon, Hwaseong-si (KR); Ho-Geon Song, Suwon-si (KR); Mitsuo Umemoto, Seongnam-si (KR); Sang-Sick Park, Hwaseong-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 133 days.

(21) Appl. No.: 13/241,517

(22) Filed: Sep. 23, 2011

(65) Prior Publication Data

US 2012/0100668 A1    Apr. 26, 2012

(30) Foreign Application Priority Data

Oct. 21, 2010 (KR) .................. 10-2010-0102984

(51) Int. Cl.
*H01L 21/00*    (2006.01)

(52) U.S. Cl.
USPC ........... 438/108; 438/107; 438/113; 438/119; 257/685; 257/738; 257/778

(58) Field of Classification Search
USPC .......... 438/107, 113, 119, 108; 257/685, 738, 257/778
See application file for complete search history.

(56) References Cited

U.S. PATENT DOCUMENTS

| 2007/0181992 A1* | 8/2007 | Lake ............................. 257/698 |
| 2009/0188102 A1* | 7/2009 | Lu et al. ....................... 29/527.1 |

FOREIGN PATENT DOCUMENTS

| JP | 2006-253342 | * | 9/2006 | ............. H01L 21/60 |
| JP | 2009-164431 | | 7/2009 | |
| KR | 10-2007-0019048 | | 2/2007 | |

* cited by examiner

*Primary Examiner* — Zandra Smith
*Assistant Examiner* — Jamie C Niesz
(74) *Attorney, Agent, or Firm* — Stanzione & Kim, LLP

(57) ABSTRACT

A method and apparatus to manufacture a flip chip package includes dotting a flux on a first preliminary bump of a package substrate, attaching a preliminary bump of a first semiconductor chip to the first preliminary bump of the package substrate via the flux, dotting a flux on a second preliminary bump of the package substrate, and attaching a preliminary bump of a second semiconductor chip to the second preliminary bump of the package substrate via the flux. Accordingly, an evaporation of the flux on the preliminary bump of the package substrate may be suppressed.

13 Claims, 11 Drawing Sheets

METHOD OF MANUFACTURING A FLIP CHIP PACKAGE AND APPARATUS TO ATTACH A SEMICONDUCTOR CHIP USED IN THE METHOD

CROSS-REFERENCE TO RELATED APPLICATIONS

This application claims priority under 35 USC§119 to Korean Patent Application No. 10-2010-0102984, filed on Oct. 21, 2010 in the Korean Intellectual Property Office (KIPO), the contents of which are herein incorporated by reference in their entirety.

BACKGROUND

1. Field of the General Inventive Concept

Example embodiments relate to a method of manufacturing a flip chip package, and an apparatus to attach a semiconductor chip used in the method. More particularly, example embodiments relate to a method of manufacturing a flip chip package including conductive bumps, and an apparatus to attach a semiconductor chip used in the method.

2. Description of the Related Art

Generally, a plurality of semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages.

The semiconductor package may include a package substrate, a semiconductor chip mounted on the package substrate, conductive connecting members to electrically connecting the semiconductor chip with the package substrate, a molding member formed on the package substrate to cover the semiconductor chip, and external terminals mounted on the package substrate.

The conductive connecting members may include conductive wires, conductive bumps, etc. A semiconductor package having a structure where a semiconductor chip and a package substrate may be connected with each other via the conductive bumps may be referred to as a flip chip package.

The conductive bump may be formed by a reflow process on preliminary bumps of the semiconductor chip and the package substrate. Before performing the reflow process, it may be required to preliminarily attach the preliminary bump of the semiconductor chip to the preliminary bump of the package substrate.

The preliminary attaching process may include coating a flux on the preliminary bump. The flux may include an adhesive, an oxide remover, etc. The adhesive may attach the preliminary bumps to each other. The oxide remover may remove a native oxide layer on the preliminary bumps. Coating the flux may include coating the flux on the preliminary bump of the semiconductor chip into coating the flux on an entire surface of the package substrate.

Conventional processes for coating the flux on the preliminary bump of the semiconductor chip may require running a chip-attaching unit for holding the semiconductor chip between a position of the semiconductor chip and a reservoir to store the flux, so that a coating time may be too long.

Further, conventional processes for coating the flux include disposing flux on the entire surface of the package substrate before a process of attaching the package substrate to the semiconductor chip is performed. Consequently, the flux on a following preliminary bump may be evaporated during attaching proceeding preliminary bumps of the semiconductor chip and the package substrate to each other, thereby causing an insufficient amount of flux to exist on conductive bumps of the package substrate. When an insufficient amount of the flux exists, adhesion strength between the preliminary bumps may be weakened, so that the conductive bump may not have sufficient strength. This weak conductive bump may cause an improper electrical connection between the semiconductor chip and the package substrate.

SUMMARY OF THE PRESENT INVENTIVE CONCEPT

At least one exemplary embodiment provides a method of manufacturing a flip chip package.

Additional features and utilities of the present general inventive concept will be set forth in part in the description which follows and, in part, will be obvious from the description, or may be learned by practice of the general inventive concept.

Example embodiments also provide an apparatus to attach a semiconductor chip used in the above-mentioned method.

According to some example embodiments, there is provided a method of manufacturing a flip chip package. In the method of manufacturing the flip chip package, a flux may be dotted on a first preliminary bump of a package substrate. A preliminary bump of a first semiconductor chip may be attached to the first preliminary bump of the package substrate using the flux. The flux may be dotted on a second preliminary bump of the package substrate. A preliminary bump of a second semiconductor chip may be attached to the second preliminary bump of the package substrate using the flux.

In some example embodiments, attaching the preliminary bumps of the first semiconductor chip and the second semiconductor chip may be performed immediately after dotting the flux to prevent the flux on the first preliminary bump and the second preliminary bump of the package substrate from being evaporated.

In some example embodiments, the method may further include converting the first preliminary bump of the package substrate and the preliminary bump of the first semiconductor chip into a first conductive bump, and converting the second preliminary bump of the package substrate and the preliminary bump of the second semiconductor chip into a second conductive bump. Converting the first preliminary bump of the package substrate and the preliminary bump of the first semiconductor chip into the first conductive bump may be performed simultaneously with converting the second preliminary bump of the package substrate and the preliminary bump of the second semiconductor chip into the second conductive bump. Converting the first preliminary bump of the package substrate and the preliminary bump of the first semiconductor chip into the first conductive bump, and converting the second preliminary bump of the package substrate and the preliminary bump of the second semiconductor chip into the second conductive bump may be performed by reflow processes.

In some example embodiments, the method may further include cutting the package substrate to separate the first semiconductor chip and the second semiconductor chip from each other.

In some example embodiments, the method may further include filling spaces between the first semiconductor chip and the package substrate, and between the second semiconductor chip and the package substrate with an insulating material.

In some example embodiments, the method may further include molding the first semiconductor chip and the second semiconductor chip.

In some example embodiments, the method may further include mounting external terminals on the package substrate.

In some example embodiments, each of the first semiconductor chip and the second semiconductor chip may include a plug connected to the preliminary bump, and a preliminary upper bump formed on the plug. The method may further include attaching a third semiconductor chip to the preliminary upper bump.

In some example embodiments, attaching the third semiconductor chip may include dotting the flux on the preliminary upper bump, and attaching a preliminary bump of the third semiconductor chip to the preliminary upper bump using the flux. Attaching the preliminary bump of the third semiconductor chip to the preliminary upper bump may include converting the preliminary upper bump and the preliminary bump of the third semiconductor chip into a third conductive bump.

In some example embodiments, the method may further include cutting the package substrate to separate the first semiconductor chip and the third semiconductor chip from the second semiconductor chip and the third semiconductor chip.

In some example embodiments, the method may further include filling spaces between the first semiconductor chip and the package substrate, between the second semiconductor chip and the package substrate, between the first semiconductor chip and the third semiconductor chip, and between the second semiconductor chip and the third semiconductor chip with an insulating material.

In some example embodiments, the method may further include molding the first semiconductor chip and the third semiconductor chip, and the second semiconductor chip and the third semiconductor chip According to some example embodiments, there is provided an apparatus to attach a semiconductor chip. The apparatus may include a flux-dotting unit and a chip-attaching unit. The flux-dotting unit may sequentially dot a flux on a first preliminary bump and a second preliminary bump of a package substrate. The chip-attaching unit may be arranged adjacent to the flux-dotting unit to sequentially attach preliminary bumps of a first semiconductor chip and a second semiconductor chip to the first preliminary bump and the second preliminary bump of the package substrate, respectively.

In some example embodiments, the flux-dotting unit may include a dotting head configured to store the flux, and a nozzle installed at the dotting head. The nozzle may have a plurality of nozzle holes to dot the flux on the first preliminary bump and the second preliminary bump.

In some example embodiments, the flux-dotting unit may further include a gap-adjusting member to adjust a gap between the nozzle and the first and second preliminary bumps. The gap-adjusting member may include a rod extending from the nozzle and selectively making contact with the package substrate, and a spring connected between the nozzle and the rod.

According to some example embodiments, the preliminary bump of the semiconductor chip may be attached to the preliminary bump of the package substrate immediately after dotting the flux on the preliminary bump of the package substrate. Thus, an evaporation of the flux on the preliminary bump of the package substrate may be suppressed. Further, a time to attach the semiconductor chip to the package substrate may be decreased. As a result, the semiconductor chip and the package substrate may be firmly attached to each other through the conductive bump.

According to another exemplary embodiment of the present general inventive concept, an apparatus that attaches a semiconductor chip includes a flux-dotting unit to deposit a first flux on at least one first substrate bump of a package substrate, and to deposit a second flux on at least one second substrate bump in response to an attachment signal, and a chip-attaching unit that attaches at least one first chip bump of a first semiconductor chip to the at least one first substrate bump in response to a flux output signal.

In yet another exemplary embodiment of the present general inventive concept, A method of manufacturing attaching a semiconductor chip to a package substrate including depositing a first flux on at least one a first substrate bump of the package substrate, generating a flux output signal in response to depositing the first flux, attaching at least one first chip bump of the first semiconductor chip to the at least one first substrate bump in response to a flux output signal, generating an attachment signal after attaching the at least one first chip bump to the at least one first substrate bump, and depositing a second flux on at least one second substrate bump in response to the attachment signal.

BRIEF DESCRIPTION OF THE DRAWINGS

These and/or other features and utilities of the present general inventive concept will become apparent and more readily appreciated from the following description of exemplary embodiments, taken in conjunction with the accompanying drawings of which.

DETAILED DESCRIPTION OF THE EXEMPLARY EMBODIMENTS

Figure 1A:
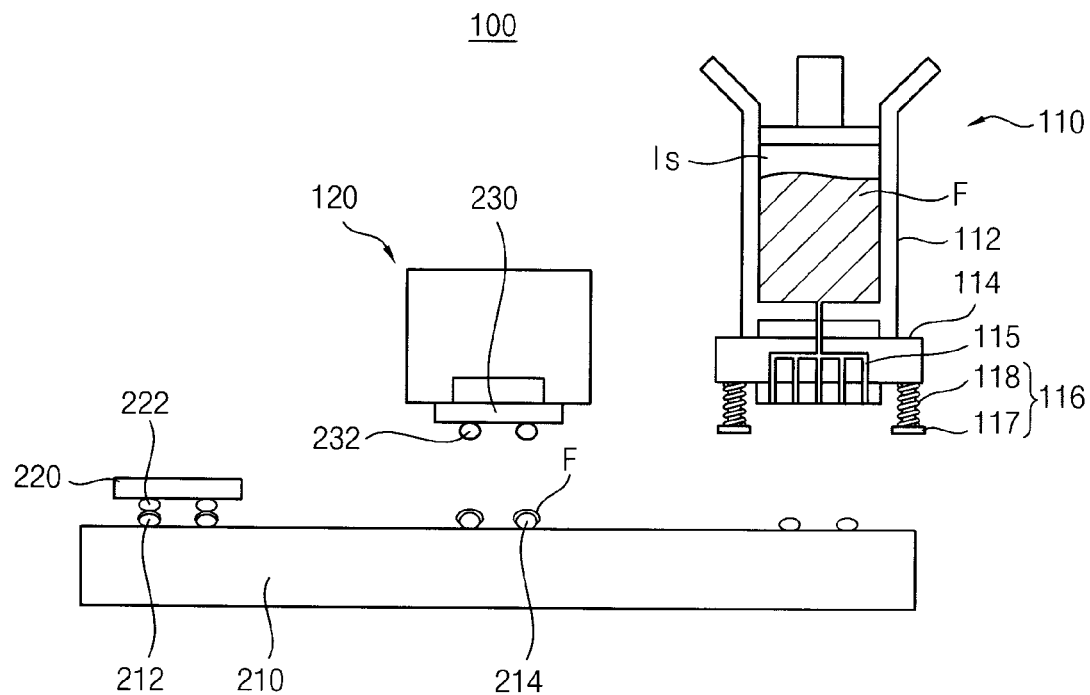
FIGS. 1A-1C is a cross-sectional view illustrating an apparatus to attach a semiconductor chip in accordance with some example embodiments of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present general inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein describes exemplary embodiments only and is not intended to limit the present general inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which the present general inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Apparatus to Align a Wafer Stage

FIG. 1A is a cross-sectional view illustrating an apparatus to attach a semiconductor chip in accordance with an exemplary embodiment of the present general inventive concept.

Referring to FIG. 1A, an apparatus 100 to attach a semiconductor chip in accordance with this example embodiment may include a flux-dotting unit 110 and a chip-attaching unit 120. The flux-dotting unit 110 and the chip-attaching unit 120 may communicate with one another during a flux depositing process and attachment process, as discussed in greater detail below.

The flux-dotting unit 110 may perform a flux depositing process to deposit flux that may couple preliminary bumps of a semiconductor chip 220 together with preliminary bumps of a package substrate 210. More specifically, the flux-dotting unit 110 may sequentially dot a flux F on a plurality of preliminary substrate bumps. The plurality of preliminary substrate bumps may include individual preliminary substrate bumps and/or a plurality of pairs of preliminary substrate bumps. For example, the plurality of preliminary substrate bumps may include a pair of first and second preliminary substrate bumps 212 and 214 on an upper surface of a package substrate 210. In some example embodiments, the flux F may include, but is not limited to, an adhesive, solder, an oxide-remover, etc. The flux F may include a liquid material or a gaseous material. Alternatively, the flux F may include an insulating paste.

The chip-attaching unit 120 may be arranged adjacent to the flux-dotting unit 110. The chip-attaching unit 120 may sequentially attach first and second semiconductor chips 220 and 230 to the first and second preliminary substrate bumps 212 and 214 on which the flux F may be dotted.

In some example embodiments, the chip-attaching unit 120 may attach a preliminary chip bump 222 of the first semiconductor chip 220 to a first preliminary substrate bump 212 just after the flux-dotting unit 110 may dot the flux F on the first preliminary substrate bump 212. In at least one exemplary embodiment, the chip-attaching unit 120 attaches the preliminary chip bump 222 of the first semiconductor chip 220 to the first preliminary substrate bump 212 immediately after the flux-dotting unit 110 may dot the flux F on the first preliminary substrate bump 212. It may be appreciated, however, that the time at which a preliminary chip bump is attached to a preliminary substrate bump may be selectively varied. The chip-attaching unit 120 may then hold the second semiconductor chip 230. The chip-attaching unit 120 holding the second semiconductor chip 230 may be located adjacent to the flux-dotting unit 110. The flux-dotting unit 110 may dot the flux F on the second preliminary substrate bump 214. The chip-attaching unit 120 may attach a second preliminary chip bump 232 of the second semiconductor chip 230 to the second preliminary substrate bump 214. That is, the flux-dotting unit 110 may not dot the flux F on all of the substrate preliminary bumps of the package substrate 210 in advance. The chip-attaching unit 120 may attach the semiconductor chip to the preliminary substrate bump of the package substrate 210 on which the flux F may be dotted immediately after dotting the flux F on any of the preliminary substrate bumps of the package substrate 210.

Therefore, because the semiconductor chip may be attached to a preliminary substrate bump of the package substrate immediately after dotting the flux F on the preliminary substrate bump of the package substrate, there may not exist a sufficient time that the flux F may be evaporated. As a result, a first preliminary chip bump 222 of the first semiconductor chip 220 and a second preliminary chip bump 232 of the second semiconductor chip 230 may be firmly attached to respective preliminary substrate bumps 212 and 214 of the package substrate 210 via a sufficient amount of the flux F. Accordingly, an electrical connection between preliminary substrate bumps of the package substrate 210 and preliminary bumps of the semiconductor chip 220 may be improved.

Figure 1B:
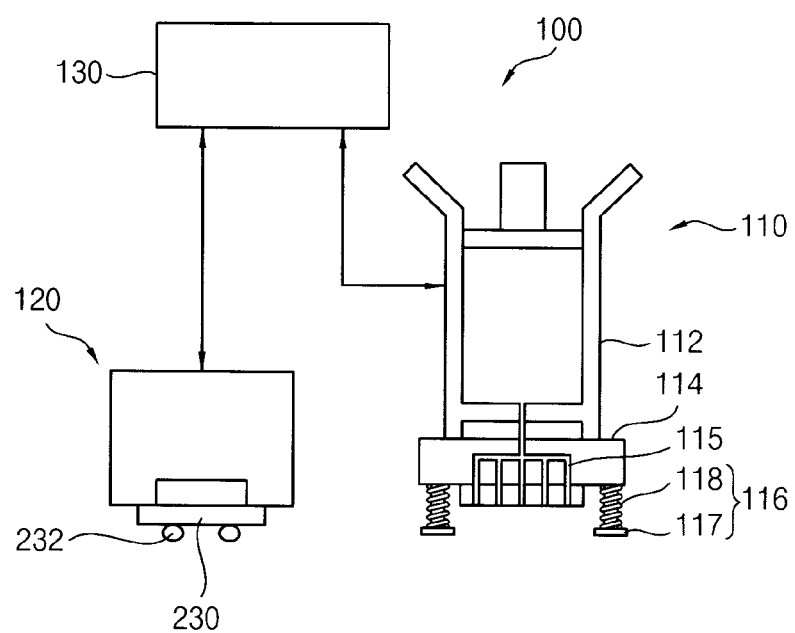

In at least one exemplary embodiment of the apparatus 100 described above, a control system may control the based on the respective dotting process and attaching process. Referring to FIG. 1B, an apparatus 100 includes an apparatus control module 130 in electrical communication with the flux-dotting unit 110 and the chip-attaching unit 120, and may determine the respective operations of the flux-dotting unit 110 and the chip-attaching unit 120. Accordingly, the apparatus control module 130 may generate and/or receive control signals based on respective operations of the flux-dotting unit 110 and/or the chip-attaching unit 120 to control the flux-dotting and chip attachment processes.

For example, the flux-dotting unit 110 may deposit a first flux on at least a first preliminary substrate bump, as discussed in detail above. The control module 130 may determine that the flux-dotting unit 110 deposited the flux, and in response generates a flux output signal. Meanwhile, the control module 130 controls the flux-dotting unit 110 to stop depositing flux until an attachment signal is generated, as discussed further below. The chip-attaching unit 120 receives the flux output signal and attaches a preliminary chip bump of the semiconductor chip 220 to the preliminary substrate bump 212 having the flux deposited thereon. In response to determining the preliminary chip bump of the semiconductor chip 220 is attached to the preliminary substrate bump 212, the apparatus control 130 generates an attachment signal. Based on the attachment signal, the flux-dotting unit 110 may deposit a second flux on a second preliminary substrate bump, as discussed above. Accordingly, since flux is not delivered from the flux-dotting unit 110 until after receiving the attachment signal, evaporation of flux deposited on a preliminary substrate bump waiting for attachment is prevented.

Figure 10:
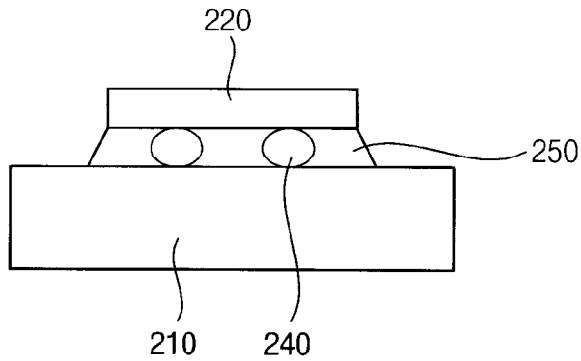

In an alternative exemplary embodiment illustrated in FIG. 10, the flux-dotting unit 110 and the chip-attaching unit 120 may include respective control modules. For example, the flux-dotting unit 110 may include a flux-dotting module 140 that generates the flux output signal in response to depositing the flux. Similarly, the chip-attaching unit 120 may include a chip-attaching module 145 that generates the attachment signal in response to attaching one or more preliminary chip bumps to a respective preliminary substrate bump. Accordingly, the flux-dotting module 140 and the chip-attaching module 145 may communicate with one another such that the flux-dotting unit 110 does not deposit flux F until after receiving the attachment signal from the chip-attaching unit 120, as described above. Thus, flux F may be prevented from evaporating from one or more preliminary substrate bumps of the package substrate due to prolonged exposure to outside air during the chip attachment process.

Further, the flux-dotting unit 110 may dot the flux F on the preliminary substrate bumps 212 and 214 of the package substrate 210, as opposed to the preliminary chip bumps 222 and 232 of the semiconductor chips 220 and 230. Thus, it may not be required to move the chip-attaching unit 120 between a reservoir to store the flux F and the package substrate 210. As a result, a time to attach the semiconductor chips 220 and 230 to the package substrate 210 may be greatly reduced.

Additionally, the apparatus 100 may further include actuators (not shown) to move vertically and horizontally both the flux-dotting unit 110 and the chip-attaching unit 120 vertically and/or horizontally. Alternatively, the apparatus 100 may further include an actuator (not shown) to move the package substrate 210.

In at least one exemplary embodiment, the flux-dotting unit 110 may include a dotting head 112 and a nozzle 114. The dotting head 112 may have an inner space (Is) configured to receive and/or store the flux F. The nozzle 114 may be connected to a lower surface of the dotting head 112. The nozzle 114 may have nozzle holes 115 in fluidic communication with an inner space (Is) of the dotting head 112. Thus, the flux F in the dotting head 112 may be supplied to the preliminary substrate bumps 212 and 214 of the package substrate 210 through one or more of the nozzle holes 115. That is, any combination of nozzle holes 115 may be utilized to deliver flux F to one or more preliminary substrate bumps of the package substrate 210.

The apparatus 100 may also include a heater (not shown) to supply heat to the flux to generate the liquid and/or gaseous flux material. The heater may be coupled to various locations of the flux-dotting unit 110 including, but not limited to, an outer surface of the flux-dotting unit 110 and an inner surface of the flux-dotting unit to heat the inner space (Is) storing the flux F.

Additionally, the flux-dotting unit 110 may further include a gap-adjusting member 116 to adjust a gap between the nozzle 114 and the package substrate 210. That is, the gap-adjusting member 116 may adjust a gap between the nozzle 114 and the preliminary substrate bumps 212 and 214 of the package substrate 210. The gap-adjusting member 116 may adjust positions of the nozzle 114 in accordance with distances between an upper surface and the preliminary substrate bumps 212 and 214 of the package substrate 210. That is, the gap-adjusting member 116 may adjust the positions of the nozzle 114 in accordance with sizes and heights of the preliminary substrate bumps 212 and 214 of the package substrate 210.

In at least one exemplary embodiment, the gap-adjusting member 116 may include a rod 117 and a spring 118 to adjust the length of the rod 117. The rod 117 extends from a lower surface of the nozzle 114 and selectively making contact with the upper surface of the package substrate 210. The spring 118 is connected between the rod 117 and the nozzle 114 to resiliently support the rod 117, and to adjust a length of the rod 117 with respect to the nozzle 114 and/or dotting head 112. For example, the spring 118 may be compressed in response to contacting the rod 117 against a surface of the package substrate. Accordingly, the distance between the rod and the nozzle 114 and/or dotting head 112 may be decreased, thereby decreasing the distance of the gap between the nozzle holes 114 and the preliminary substrate bumps 212 and 214 of the package substrate 210.

Method of Manufacturing a Flip Chip Package

Figure 1C:
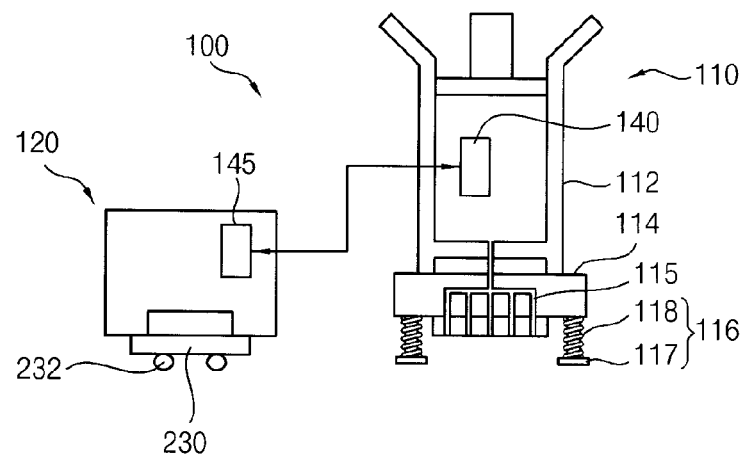

FIGS. 2 to 12 are cross-sectional views illustrating a method of manufacturing a flip chip package using the apparatus in FIG. 1 in accordance with some example embodiments.

Figure 2:
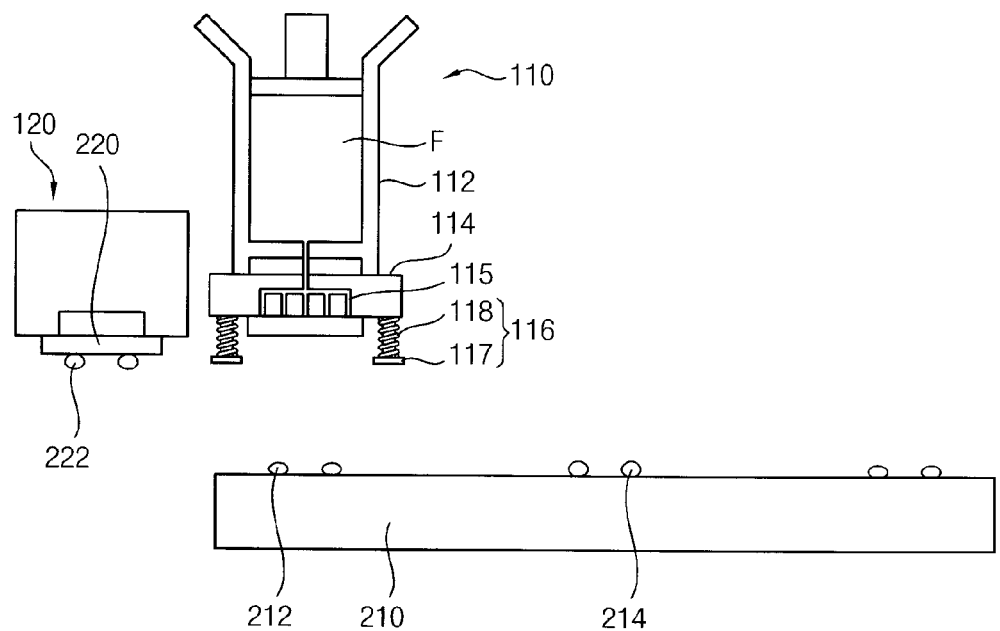
FIGS. 2 to 12 are cross-sectional views illustrating a method of manufacturing a flip chip package in accordance with some example embodiments.

Referring to FIG. 2, the flux-dotting unit 110 may be arranged over at least one first preliminary substrate bump 212 of the package substrate 210. The chip-attaching unit 120 may be arranged adjacent to the flux-dotting unit 110 with holding the first semiconductor chip 220.

Figure 3:
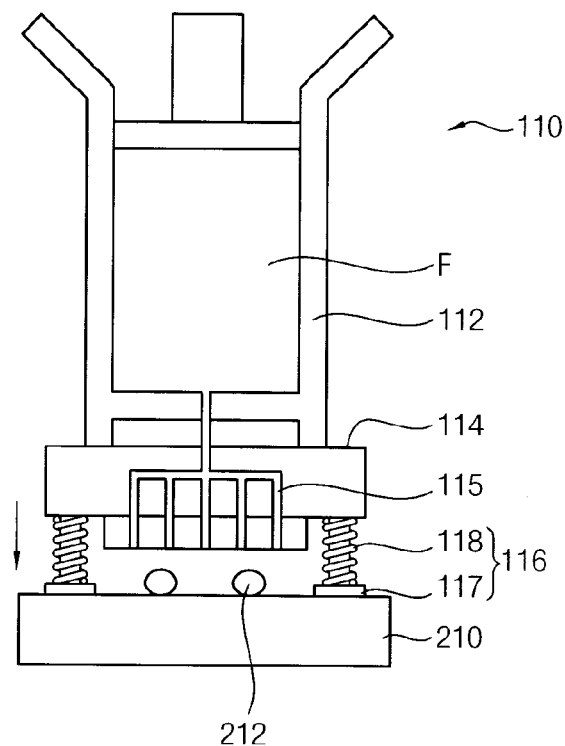

Referring to FIG. 3, the flux-dotting unit 110 may be descended toward the package substrate 210. The rods 117 may make contact with the upper surface of the package substrate 210.

Figure 4:
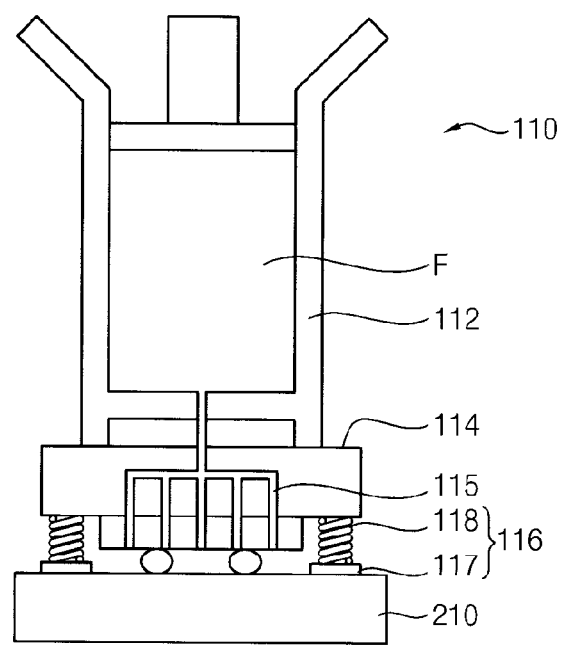

Referring to FIG. 4, the flux-dotting unit 110 may be continuously descended with the spring 118 being compressed, so that the nozzle 114 may be positioned adjacent to the first preliminary substrate bump 212 of the package substrate 210. When the nozzle 114 may approach a proper position, the flux F in the dotting head 112 may be dotted on the first preliminary substrate bump 212 of the package substrate 210 through the nozzle holes 115. In at least one exemplary embodiment, the flux F may include an adhesive, an oxide remover, etc. The flux F may include, but is not limited to, a liquid material and a gaseous material. Alternatively, the flux F may include an insulating paste.

Figure 5:
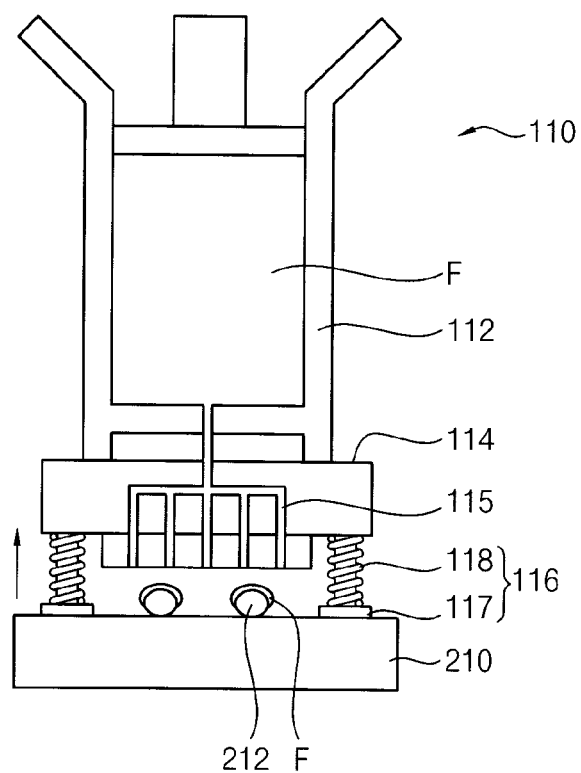

Referring to FIG. 5, after dotting the flux F on the first preliminary substrate bump 212 of the package substrate 210, the flux-dotting unit 110 may be ascended.

Figure 6:
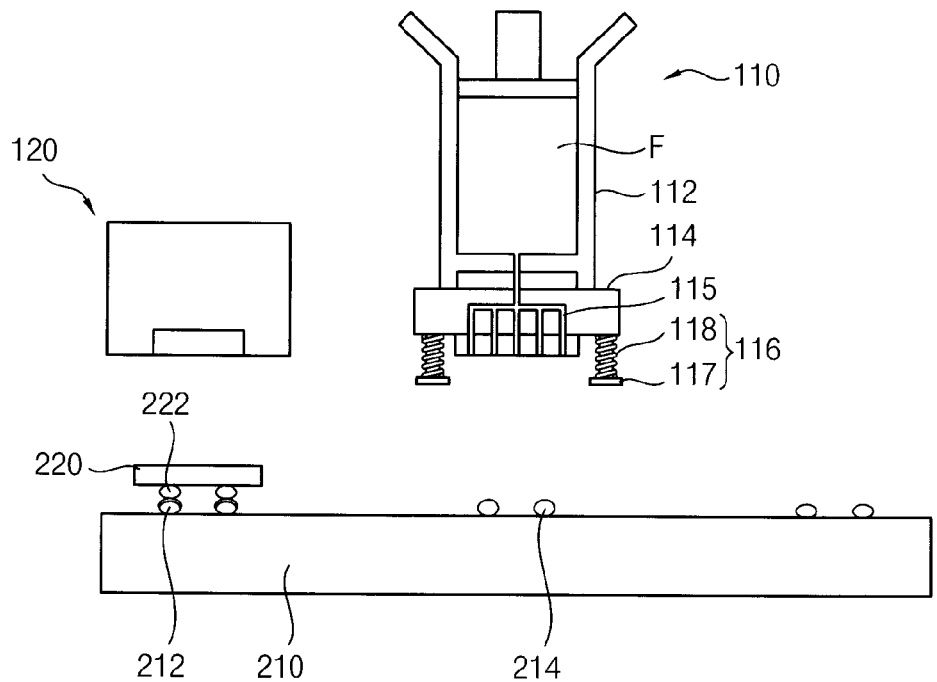

Referring to FIG. 6, the flux-dotting unit 110 may be moved to a position over the second preliminary substrate bump 214 of the package substrate 210. The chip-attaching unit 120 may be arranged over the first preliminary substrate bump 212 of the package substrate 210 on which the flux F may be dotted. The chip-attaching unit 120 may be descended to contact the preliminary chip bump 222 of the first semiconductor chip 220 with the first preliminary substrate bump 212 of the package substrate 210. Heat may be applied to the preliminary chip bump 222 of the first semiconductor chip 220 and the first preliminary substrate bump 212 of the package substrate 210 to attach the preliminary chip bump 222 of the first semiconductor chip 220 to the first substrate preliminary bump 212 of the package substrate 210. The heat may be applied by a flux heater (not shown) coupled to an external portion of the chip-attaching unit 120, or an external heater (not shown) that applies the heat after the first semiconductor chip 220 and the first preliminary substrate bump 212 of the package substrate 210 to attach the preliminary chip bump 222 of the first semiconductor chip 220 to the first substrate preliminary bump 212 of the package substrate 210. In some example embodiments, the preliminary chip bump 222 of the first semiconductor chip 220 may be attached to the first substrate preliminary bump 212 of the package substrate 210 immediately after dotting the flux F on the first preliminary substrate bump 212 of the package substrate 210. Thus, a time when the flux exists on a preliminary substrate bump without being attached to a preliminary chip bump is decreased, thereby reducing evaporation of the flux during the semiconductor chip attachment process.

Figure 7:
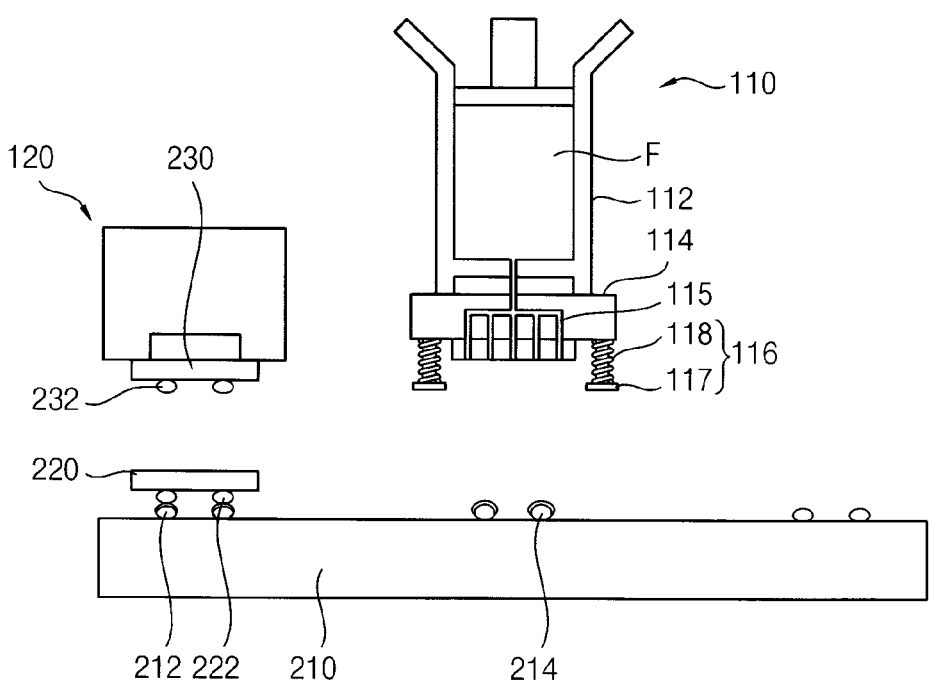

Referring to FIG. 7, the chip-attaching unit 120 may be positioned adjacent to the flux-dotting unit 110 with holding the second semiconductor chip 230.

Figure 8:
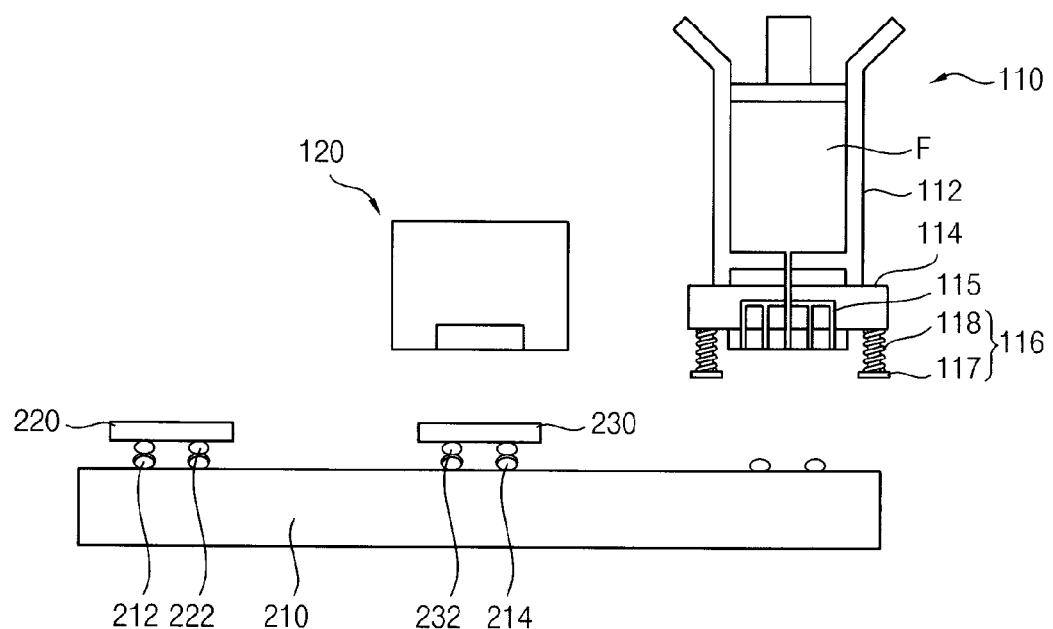

Processes substantially the same as those illustrated with reference to FIGS. 3 to 6 may be performed to attach at least one second preliminary chip bump 232 of the second semiconductor chip 230 to at least one second preliminary substrate bump 214 of the package substrate 210 in FIG. 8.

Figure 9:
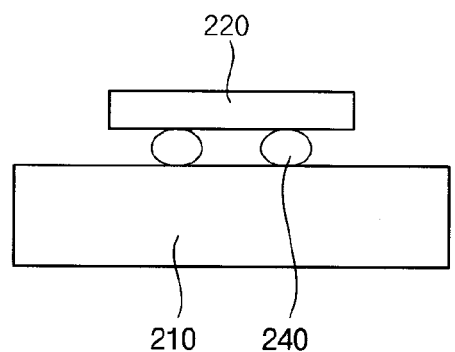

Referring to FIG. 9, the package substrate 210 may be cut to separate the first semiconductor chip 220 and the second semiconductor chip 230 from each other. A reflow process may be performed on the first semiconductor chip 220 to convert the preliminary bumps 212 and 222 into the conductive bump 240. That is, the reflow process may combine a preliminary substrate bump 212 that is attached to a preliminary chip 222 into a single conductive bump 240. Because the flux F may be evaporated during the reflow process, the flux F may be almost removed. A reflow process with respect to the second semiconductor chip 230 may be substantially the same as the reflow process with respect to the first semiconductor chip 220. Thus, any further illustrations with respect to the reflow process on the second semiconductor chip 230 may be omitted herein for brevity. Alternatively, before cutting the package substrate 210, the reflow process may be performed on the first semiconductor chip 220 and the second semiconductor chip 230.

Referring to FIG. 10, an underfilling layer 250 may be formed between the first semiconductor chip 220 and the package substrate 210 to surround the conductive bump 240 with the underfilling layer 250.

Alternatively, when the flux F includes the insulating paste, the insulating paste may not be removed by the reflow process. That is, the insulating paste may be converted into the underfilling layer 250 after the reflow process. Thus, when the flux F may include the insulating paste, the process to form the underfilling layer 250 may be omitted.

Figure 11:
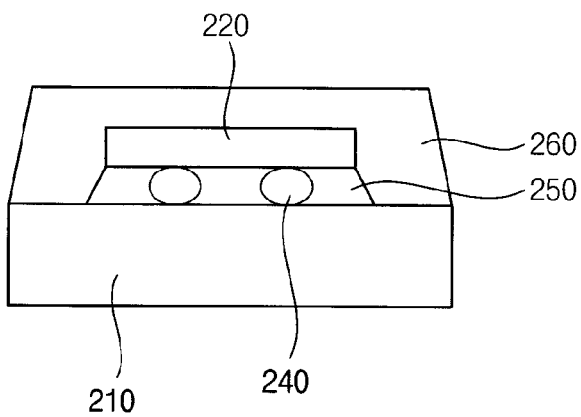

Referring to FIG. 11, a molding member 260 may be formed on the package substrate 210 to cover the first semiconductor chip 220. In some example embodiments, the molding member 260 may include an epoxy molding compound (EMC).

Figure 12:
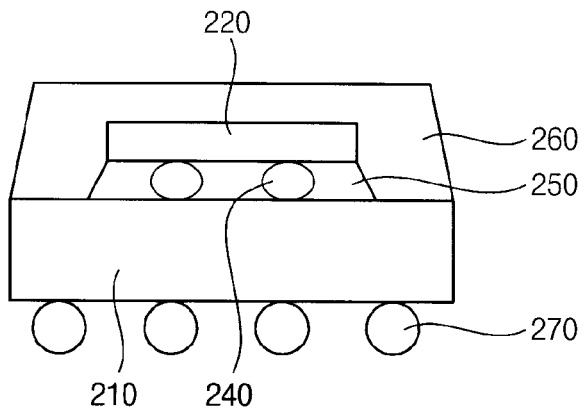

Referring to FIG. 12, external terminals 270 may be mounted on a lower surface of the package substrate 210 to complete a flip chip package. In some example embodiments, the external terminals 270 may include solder balls.

FIGS. 13 to 20 are cross-sectional views illustrating an exemplary method of manufacturing a flip chip package using the apparatus in FIG. 1 in accordance with some example embodiments.

The flip chip package of at least one example embodiment illustrated in FIGS. 13-20 may correspond to a multi-chip package 223 including sequentially stacked semiconductor chips and plugs 224 included in the semiconductor chips.

Processes substantially the same as those illustrated with reference to FIGS. 2 to 5 may be performed to attach a first preliminary chip bump 222 of the first semiconductor chip 220 to a first preliminary substrate bump 212 of the package substrate 210.

In some example embodiments, the first semiconductor chip 220 may include a plug 224. The plug 224 may be vertically disposed in the first semiconductor chip 220. Thus, the plug 224 may have a lower end exposed through a lower surface of the first semiconductor chip 220, an upper end exposed through an upper surface of the first semiconductor chip 220. The preliminary chip bump 222 of the first semiconductor chip 220 may be formed on the lower end of the plug 224. An upper preliminary bump 226 may be formed on the upper end of the plug 224.

Figure 13:
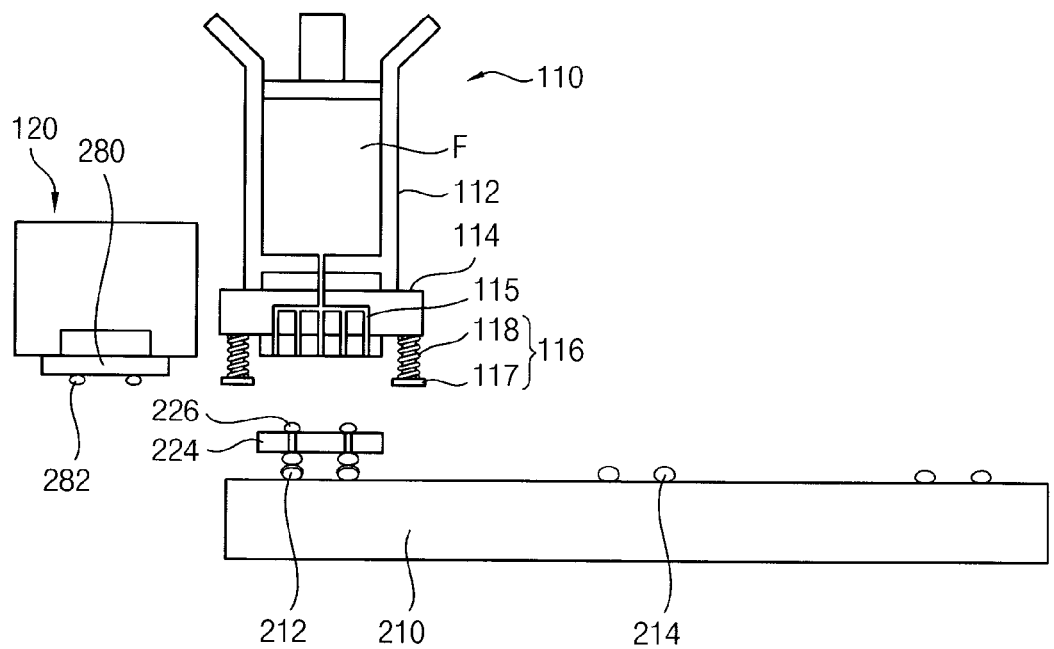
FIGS. 13 to 20 are cross-sectional views illustrating a method of manufacturing a flip chip package in accordance with some example embodiments.

Referring to FIG. 13, after attaching the first semiconductor chip 220 to the package substrate 210, the flux-dotting unit 110 may be still positioned over the first preliminary substrate bump 212 of the package substrate 210. The chip-attaching unit 120 may be arranged adjacent to the flux-dotting unit 110 with holding a third semiconductor chip 280.

Figure 14:
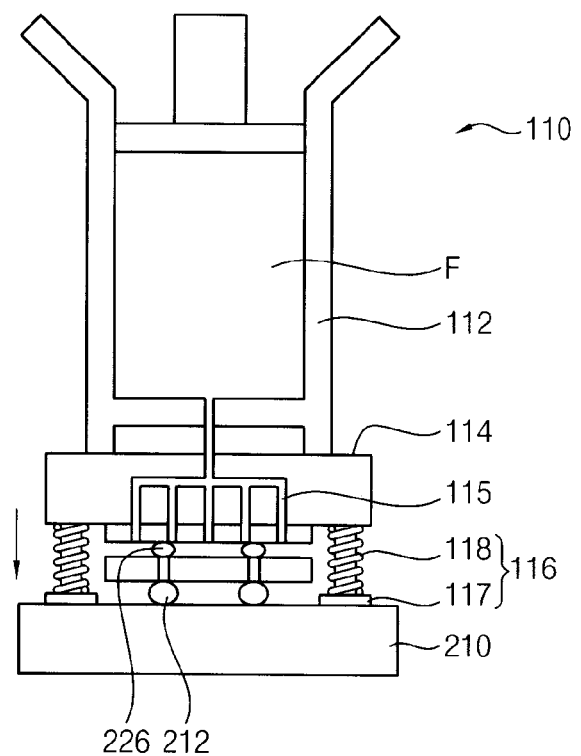

Referring to FIG. 14, the flux-dotting unit 110 may be descended toward the package substrate 210. The rods 117 may make contact with the upper surface of the package substrate 210.

Figure 15:
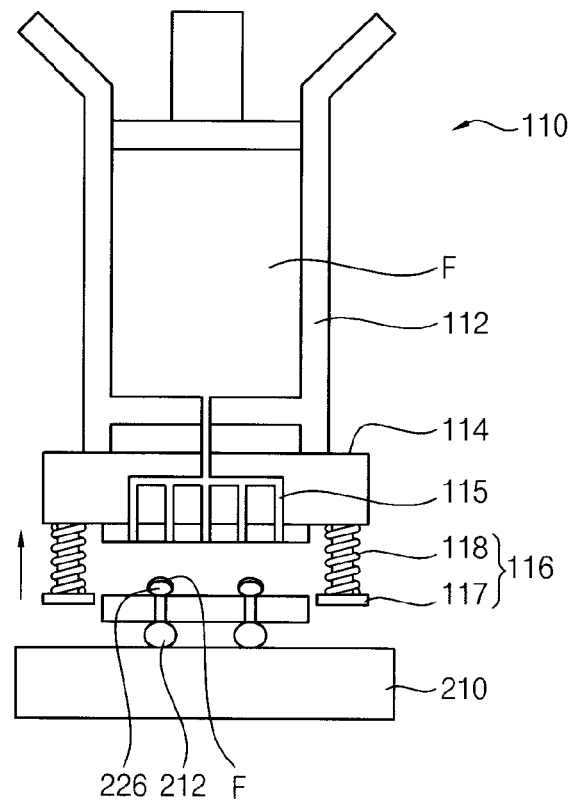

Referring to FIG. 15, the flux-dotting unit 110 may be continuously descended with the spring 118 being compressed, so that the nozzle 114 may be positioned adjacent to the upper preliminary bump 226. When the nozzle 114 may approach a proper position, the flux F in the dotting head 112 may be dotted on the upper preliminary bump 226 through the nozzle holes 115.

Figure 16:
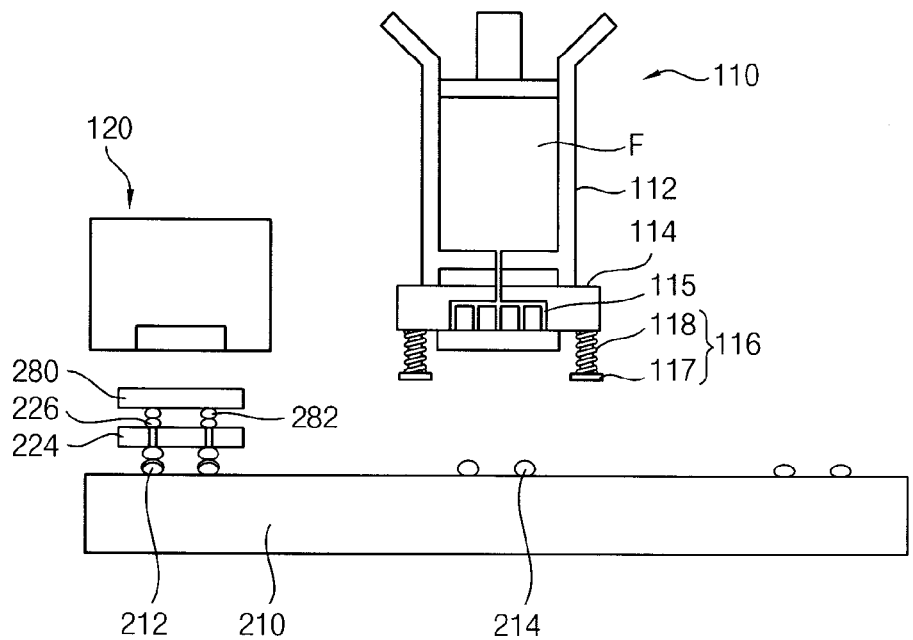

Referring to FIG. 16, the flux-dotting unit 110 may be moved to a position over the second preliminary substrate bump 214 of the package substrate 210. The chip-attaching unit 120 may be arranged over the upper preliminary bump 226 on which the flux F may be dotted. The chip-attaching unit 120 may be descended to attach the upper preliminary bump 226 of the first semiconductor chip 220 to a preliminary chip bump 282 of the third semiconductor chip 280 to construct the multi-chip package 223.

Processes substantially the same as those illustrated with reference to FIGS. 13 to 16 may be performed to the third semiconductor chip 280 to the second semiconductor chip 230 to construct a multi-chip package having additional layers to those of the exemplary embodiment illustrated in FIGS. 13-16.

Figure 17:
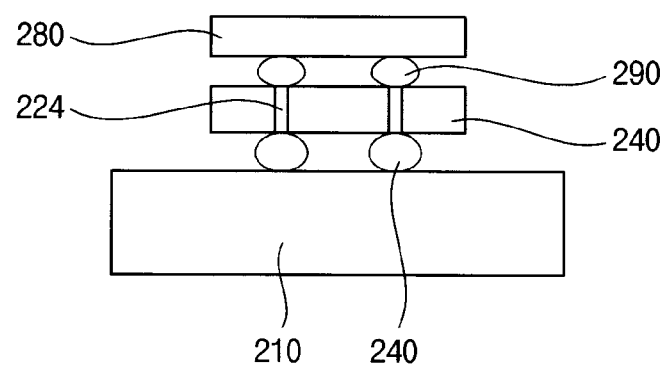

Referring to FIG. 17, the package substrate 210 may be cut to separate the first semiconductor chip 220 and the third semiconductor chip 280 from the second semiconductor chip 230 and the third semiconductor chip 280. A reflow process may be performed on the first semiconductor chip 220 and the third semiconductor chip 280 to convert the first preliminary substrate bump 212 of the package substrate 210 and the preliminary chip bump 222 of the first semiconductor chip 220 into the conductive bump 240, and the upper preliminary bump 226 of the first semiconductor chip 220 and the preliminary chip bump 282 of the third semiconductor chip 280 into a conductive bump 290.

Figure 18:
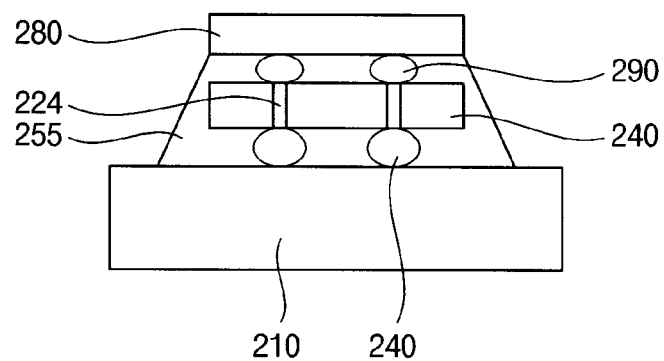

Referring to FIG. 18, an underfilling layer 255 may be formed between the first semiconductor chip 220 and the package substrate 210, and between the first semiconductor chip 220 and the third semiconductor chip 280 to surround the conductive bumps 240 and 290 with the underfilling layer 255. When the flux F may include the insulating paste, the process to form the underfilling layer 255 may be omitted.

Figure 19:
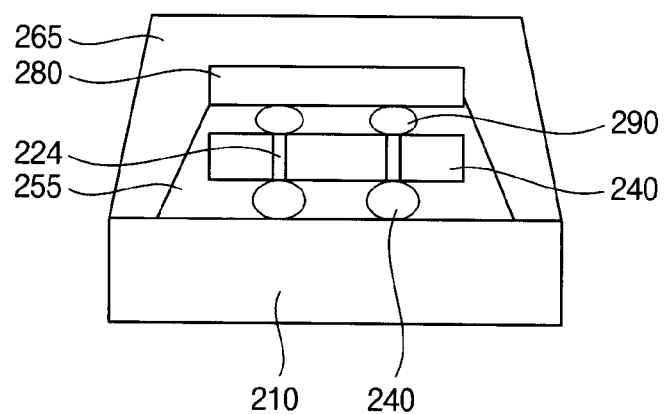

Referring to FIG. 19, a molding member 265 may be formed on the package substrate 210 to cover the first semiconductor chip 220 and the third semiconductor chip 280. In some example embodiments, the molding member 265 may include an epoxy molding compound (EMC).

Figure 20:
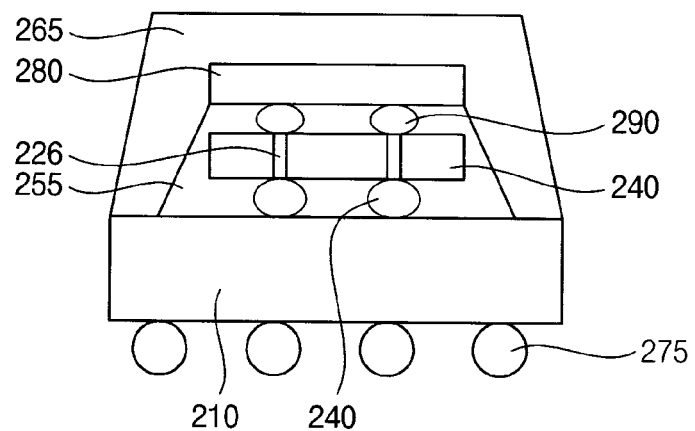

Referring to FIG. 20, external terminals 275 may be mounted on a lower surface of the package substrate 210 to complete a flip chip package. In some example embodiments, the external terminals 275 may include solder balls.

According to some example embodiments, a preliminary chip bump of the semiconductor chip may be attached to a preliminary substrate bump of the package substrate just after dotting the flux on the preliminary substrate bump of the package substrate. Thus, an evaporation of the flux on the preliminary substrate bump of the package substrate may be suppressed. Further, a time to attach the semiconductor chip to the package substrate may be decreased. As a result, the semiconductor chip and the package substrate may be firmly attached to each other through the conductive bump.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a flip chip package, the method comprising:
    dotting a flux on a first preliminary bump of a package substrate;
    attaching a preliminary bump of a first semiconductor chip to the first preliminary bump of the package substrate;
    dotting the flux on a second preliminary bump of the package substrate after the preliminary bump of the first semiconductor chip is attached to the first preliminary bump of the package substrate; and
    attaching a preliminary bump of a second semiconductor chip to the second preliminary bump of the package substrate.

2. The method of claim 1, wherein attaching the preliminary bumps of the first and second semiconductor chips to the first and second preliminary bumps of the package substrate are performed just after dotting the flux on the first and second preliminary bumps of the package substrate to prevent the flux from being evaporated.

3. The method of claim 1, further comprising:
    converting the first preliminary bump of the package substrate and the preliminary bump of the first semiconductor chip into a first conductive bump; and
    converting the second preliminary bump of the package substrate and the preliminary bump of the second semiconductor chip into a second conductive bump.

4. The method of claim 3, wherein converting the first preliminary bump of the package substrate and the preliminary bump of the first semiconductor chip into a first conductive bump is performed simultaneously with converting the second preliminary bump of the package substrate and the preliminary bump of the second semiconductor chip into a second conductive bump.

5. The method of claim 1, further comprising cutting the package substrate to separate the first semiconductor chip and the second semiconductor chip from each other.

6. The method of claim 5, further comprising forming an underfilling layer between the first and second semiconductor chips and the package substrate.

7. The method of claim 5, further comprising molding the first semiconductor chip and the second semiconductor chip.

8. The method of claim 1, wherein each of the first semiconductor chip and the second semiconductor chip comprises a plug connected to the preliminary bump and an upper preliminary bump formed on the plug, and a third semiconductor chip and a fourth semiconductor chip are attached to the upper preliminary bumps, respectively.

9. The method of claim 8, wherein attaching the third semiconductor chip to the upper preliminary bump comprises:
    dotting the flux on the upper preliminary bump; and
    attaching a preliminary bump of the third semiconductor chip to the upper preliminary bump.

10. The method of claim 8, wherein attaching the third semiconductor chip to the upper preliminary bump further comprises converting the upper preliminary bump of the first semiconductor chip and the preliminary bump of the third semiconductor chip into a third conductive bump.

11. The method of claim 8, further comprising cutting the package substrate to separate the first semiconductor chip and the third semiconductor chip from the second semiconductor chip and the fourth semiconductor chip.

12. A method of attaching a semiconductor chip to a package substrate, the method comprising:
    depositing a first flux on at least one a first substrate bump of the package substrate;
    generating a flux output signal in response to depositing the first flux;
    attaching at least one first chip bump of the first semiconductor chip to the at least one first substrate bump in response to the flux output signal;
    generating an attachment signal after attaching the at least one first chip bump to the at least one first substrate bump; and
    depositing a second flux on at least one second substrate bump of the package substrate in response to the attachment signal after the at least one first chip bump is attached to the at least one first substrate bump.

13. The method of claim 12, further comprising reflowing a third flux on the attached at least one first chip bump and at least one first substrate bump to form a first single conductive bump and reflowing a fourth flux on the attached at least one second chip bump and at least one second substrate bump to form a second single conductive bump in response to forming the first conductive bump.

* * * * *